(12) United States Patent
Schulze et al.

(10) Patent No.: US 8,541,833 B2
(45) Date of Patent: Sep. 24, 2013

(54) POWER TRANSISTOR DEVICE VERTICAL INTEGRATION

(75) Inventors: Hans-Joachim Schulze, Taufkirchen (DE); Anton Mauder, Kolbermoor (DE); Helmut Strack, München (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 72 days.

(21) Appl. No.: 13/082,679

(22) Filed: Apr. 8, 2011

(65) Prior Publication Data

US 2012/0256250 A1   Oct. 11, 2012

(51) Int. Cl.
*H01L 29/66* (2006.01)
*H01L 21/70* (2006.01)

(52) U.S. Cl.
USPC ........... 257/328; 257/287; 257/499; 257/500; 257/578

(58) Field of Classification Search
USPC ................. 257/328, 341, 503, 330, 207, 401, 257/491, 287, 499, 500, 502, 578
See application file for complete search history.

(56) References Cited

U.S. PATENT DOCUMENTS

| | | | |
|---|---|---|---|
| 5,550,066 A * | 8/1996 | Tang et al. | 438/29 |
| 7,459,365 B2 | 12/2008 | Rüb et al. | |
| 7,709,891 B2 | 5/2010 | Mauder et al. | |
| 2007/0023830 A1 | 2/2007 | Pfirsch et al. | |
| 2008/0217602 A1 * | 9/2008 | Kahen | 257/13 |
| 2010/0078713 A1 | 4/2010 | Mauder et al. | |
| 2011/0227078 A1 * | 9/2011 | Park et al. | 257/59 |

OTHER PUBLICATIONS

Herzer, R. et al., "IGBT Gate Driver Solutions for Low and Medium Power Applications", 2010 Power Electronics Europe, Issue 6, 18 IGBT Drivers.
Roβberg, M. et al., "600 V SOI Gate Driver IC with Advanced Level Shifter Concepts for Medium and High Power Applications", http://www.semikron.com.

* cited by examiner

*Primary Examiner* — Chuong A. Luu
(74) *Attorney, Agent, or Firm* — Murphy, Bilak & Homiller, PLLC

(57) ABSTRACT

A semiconductor component includes a sequence of layers, the sequence of layers including a first insulator layer, a first semiconductor layer disposed on the first insulator layer, a second insulator layer disposed on the first semiconductor layer, and a second semiconductor layer disposed on the second insulator layer. The semiconductor component also includes a plurality of devices at least partly formed in the first semiconductor layer. A first one of the plurality of devices is a power transistor formed in a first region of the first semiconductor layer and a first region of the second semiconductor layer. The first region of the first and second semiconductor layers are in electrical contact with one another through a first opening in the second insulator layer.

14 Claims, 21 Drawing Sheets

POWER TRANSISTOR DEVICE VERTICAL INTEGRATION

FIELD OF TECHNOLOGY

The present application relates to vertical integration of power transistor devices, in particular vertical integration of power transistor devices using stacked SOI (silicon-on-insulator) structures.

BACKGROUND

Power semiconductors, in particular for higher voltage applications, require precise control of wafer thickness to reduce losses. When a power transistor is on, the difference between the drain (collector) voltage and the source (emitter) voltage of the transistor is only a few Volts. However, the difference between the drain and source connections jumps to multiples of 100 V or even multiples of 1,000 V during the blocking (off) state. The corresponding blocking voltage of the power transistor, which enables the transistor to withstand high off-state voltages, can be reduced depending on the thickness of the semiconductor material in the space-charge zone of the transistor. Some applications such as control functions are required to cope with this variable potential difference.

For example, level-shift transistors can be used to transmit in an arrangement of semiconductors a control signal with two power circuit switches from the control circuit at the lower switch on the source to the gate of the upper transistor. The gate of the upper transistor is related to the variable potential of the middle tap of the half-bridge and responds to this potential. Until recently, external semiconductor circuits were required. The external circuits must be equipped with a high isolation strength, such as for example optical couplers, transformers or special control switches on an SOI base material. Diodes have also been used which are coupled from a drift control zone of a TEDFET (trench extended drain field effect transistor) to the drain. The drift control zone controls the conducting channel in the drift zone when the transistor is driven in the on state (i.e. switched on). However, in each case a vertical integration of the power circuit switch has not been realized to date.

SUMMARY

According to an embodiment of a semiconductor component, the component includes a sequence of layers including a first insulator layer, a first semiconductor layer disposed on the first insulator layer, a second insulator layer disposed on the first semiconductor layer, and a second semiconductor layer disposed on the second insulator layer. The semiconductor component also includes a plurality of devices at least partly formed in the first semiconductor layer. A first one of the plurality of devices is a power transistor formed in a first region of the first semiconductor layer and a first region of the second semiconductor layer. The first region of the first and second semiconductor layers are in electrical contact with one another through a first opening in the second insulator layer.

According to an embodiment of a method of manufacturing a semiconductor component, the method includes forming a sequence of layers including a first insulator layer, a first semiconductor layer disposed on the first insulator layer, a second insulator layer disposed on the first semiconductor layer, and a second semiconductor layer disposed on the second insulator layer. The method further includes forming a plurality of devices at least partly formed in the first semiconductor layer, a first one of the plurality of devices being a power transistor formed in a first region of the first semiconductor layer and a first region of the second semiconductor layer, the first region of the first and second semiconductor layers being in electrical contact with one another through a first opening in the second insulator layer.

According to an embodiment of a semiconductor component, the component includes a sequence of layers including a first insulator layer, a first semiconductor layer disposed on the first insulator layer, a second insulator layer disposed on the first semiconductor layer, and a second semiconductor layer disposed on the second insulator layer. The semiconductor also includes a power transistor having a drain formed in a first region of the first semiconductor layer and a drift zone, body, source and gate formed in a first region of the second semiconductor layer. The drift zone is electrically connected to the drain through a first opening in the second insulator layer. The semiconductor further includes a diode having an anode and a cathode formed in a second region of the first semiconductor layer. The anode is electrically connected to the drain of the power transistor. The cathode is electrically connected to a second region of the second semiconductor layer through a second opening in the second insulator layer. The first and second regions of the second semiconductor layer are laterally insulated from one another.

According to an embodiment of a method of manufacturing a semiconductor component, the method includes forming a sequence of layers including a first insulator layer, a first semiconductor layer disposed on the first insulator layer, a second insulator layer disposed on the first semiconductor layer, and a second semiconductor layer disposed on the second insulator layer and forming a power transistor including at least a part of a drain in a first region of the first semiconductor layer. The power transistor also includes a drift zone, body, source and gate in a first region of the second semiconductor layer. The method further includes electrically connecting the drift zone and the drain through a first opening in the second insulator layer and forming a diode including an anode and a cathode in a second region of the first semiconductor layer. The method also includes electrically connecting the anode and the drain through a first opening in the first insulator layer, electrically connecting the cathode and a second region of the second semiconductor layer through a second opening in the second insulator layer, and laterally insulating the first and second regions of the second semiconductor layers from one another.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments disclosed herein describe vertically integrated structural elements of power transistor circuits such as power circuit switches. The reference potential of power circuit switches e.g. the drain (collector) potential can be applied to other structural elements integrated in the power transistor circuit. These structural elements can be at least partly deployed vertically between two insulation layers such as oxide layers on the rear side of the component. A connection in the upward direction can be realized selectively with a slightly doped path that can sustain the blocking voltage of the power transistor circuit (for example for level shift applications in a half bridge or for voltage sensing purpose at the drain terminal), but also through a low-impedance path (for example outside of the lateral edge termination of the front side of the chip, or for example with an insulated trench filled with polysilicon or carbon).

Figure 1:
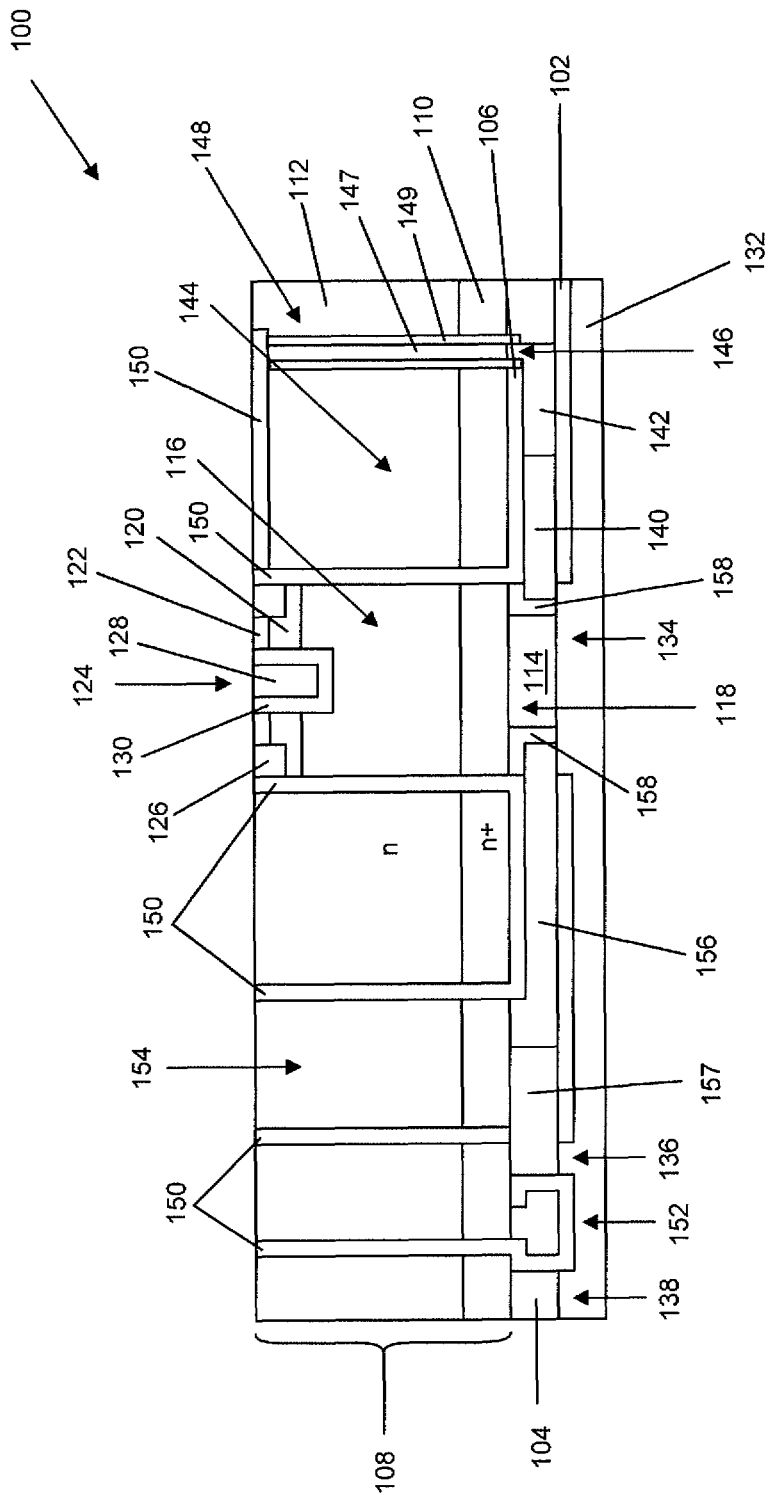
FIG. 1 illustrates a cross-sectional schematic view of a vertically integrated semiconductor component according to an embodiment.

FIG. 1 schematically shows a partial cross section through a semiconductor component 100 which includes a sequence of layers. The sequence of layers includes a first insulator layer 102, a first semiconductor layer 104 disposed on the first insulator layer 102, a second insulator layer 106 disposed on the first semiconductor layer, and a second semiconductor layer 108 disposed on the second insulator layer 106. The first semiconductor layer 104 is also referred to herein as the lower or buried semiconductor layer, the second semiconductor layer 108 as the upper semiconductor layer, the first insulator layer 102 as the lower insulator layer, and the second insulator layer 106 as the upper insulator layer for descriptive purposes only with respect to the interrelationship of these layers as shown in the Figures. Of course, additional layers may be above and/or below any of these particular layers. With this understanding, the lower semiconductor layer 104 is interposed between the lower insulator layer 102 and the upper insulator layer 106, and the upper insulator layer 106 is interposed between the lower semiconductor layer 104 and the upper semiconductor layer 108.

A plurality of devices are at least partly formed in the lower semiconductor layer 104. One of the devices is a power transistor which is formed in a first region 114 of the first lower layer 104 and a first region 116 of the upper semiconductor layer 108. The first region 114, 116 of the first and second semiconductor layers 104, 108 are in electrical contact with one another through a first opening 118 in the upper insulator layer 106. In one embodiment, the first region 114 of the lower semiconductor layer 104 forms at least part of the drain of the power transistor and the first region 116 of the upper semiconductor layer 108 includes a drift zone of the power transistor. In some embodiments, the drain includes a highly doped region (e.g. first region 114) in electrical contact with the drift zone. In general, the drain and source doping type are the same type. The drain and source can have the same or complementary doping type as the drift zone. Body region 120 has the complementary doping type as the source and part of the drain region. Above the drain a higher n-doped section 110 forms at least a portion of the counterpart to the body. In between the doping of drift zone is relatively low to sustain the blocking voltage, and either n-type or p-type doping is possible. According to some embodiments, part of the drain is included in the upper semiconductor layer 108. In other embodiments, the drain of the power transistor is contained entirely within the lower semiconductor layer 104.

A body region 120 of the power transistor is also formed in the first region 116 of the upper semiconductor layer 108 above the drift zone. The source 122, gate 124 and a highly conductive contact zone 126 of the power transistor are formed in or on the body region 120 and source region 122. A channel zone arises in the body region 120 between the source 122 and the drift zone when a sufficient voltage is applied to the gate 124, causing the transistor to switch on in a conducting state. The gate 124 includes a gate electrode 128 insulated from the body 120 by a gate dielectric 130. In other embodiments, the gate 124 and/or the highly conductive contact zone 126 can be formed at least partially on or above the body region 120 and the drift zone.

The power transistor illustrated in FIG. 1 is a vertical MOSFET (metal oxide semiconductor field effect transistor). Other types of vertical power transistors could be fabricated in place of the MOSFET, such as an IGBT (insulated gate bipolar transistor), JFET (junction field effect transistor), diode, etc. Also in some embodiments, the upper semiconductor layer 108 can be more heavily doped closer to the upper insulator layer 106 as indicated by n+ section 110 and less heavily doped further away from the upper insulator layer 106 as indicated by n section 112 depending on the type of devices being constructed. The n-type doping is merely used for illustrative purposes only and should not be considered limiting in any way. Of course, the first and second semiconductor layers 104, 108 as well as n+ section 110 may have p-type and/or n-type conductivity regions as desired.

A metallization layer 132 is disposed on a side of the lower insulator layer 102 facing away from the lower semiconductor layer 104. As such, the lower insulator layer 102 is interposed between the metallization layer 132 and the lower semiconductor layer 104. The metallization layer 132 is in electrical contact with a plurality of regions of the lower semiconductor layer 104 including the drain 114 of the power transistor through corresponding openings 134, 136, 138 in the lower insulator layer 102. The metallization layer 132 can be used as a rear-side gate, which for example controls a hole channel, or for a bidirectional IGBT or a MOSFET having a targeted hole injection on the drain side. In each case, the lower insulator layer 102 can be patterned to provide the desired electrical contacts between the metallization layer 132 and the devices formed in the lower semiconductor layer 104. The metallization layer 132 can cover substantially the entire chip backside or can be patterned to provide insulated electrodes.

In one embodiment, a diode having an anode 140 and a cathode 142 is formed in a region of the lower first semiconductor layer 104 adjacent the drain 114 of the power transistor. The anode 140 is in electrical contact with the metallization layer 132 through an opening 134 in the lower insulator layer 102 e.g. the same opening through which the metallization layer 132 contacts the drain 114 of the power transistor as shown in FIG. 1. The cathode 142 of the diode is capacitively coupled to a region 144 of the upper semiconductor layer 108 adjacent the drift zone of the power transistor through a corresponding opening 146 in the upper insulator layer 106 and a conductive trench 148. In an alternative embodiment the cathode is in electrical contact with the higher doped zone 110 or may be at least partially formed by the higher doped zone 110 (contact in upper insulator layer 106 is not shown in FIG. 1) and therefore the cathode is in electrical contact with the rear side of the drift control zone. The diode connections can be reversed if desired.

The conductive trench 148 includes a conductive material 147 surrounded by an insulating layer 149 deposited on the trench side wall. This region 144 of the upper semiconductor layer 108 forms a drift control zone which controls a conducting channel in the drift zone of the power transistor. The drift zone and the drift control zone are laterally insulated from one another by the insulating layer 150 which extends vertically through the upper semiconductor layer 108 to the upper insulator layer 106 in a direction generally perpendicular to the top side of the upper semiconductor layer 108. The insulating layer 150 forms the dielectric between the drift control region 144 and the drift region 116, and dielectric 149 insulates the conductive trench 148 from all other regions.

Integrating the diode at the rear side of the drift control zone in the lower semiconductor layer 104 permits the diode to have a large surface area over most of the semiconductor component chip and thus helps to draw thermal leakage currents away from the drift control zone even at extreme temperatures, yielding a robustness design in case of e.g. an avalanche or short circuit condition. For this purpose, the cathode 142 is in electrical contact with the lower side of the drift control zone through the opening 146 in the upper insulator layer 106, and the anode 140 is in electrical contact with the rear side metallization 132.

Additional devices can be at least partly formed in the lower semiconductor layer 104. In one embodiment, a level shifter is provided which has a gate 152 formed in a region of the lower semiconductor layer 104 laterally insulated from other regions of the lower semiconductor layer 104. The gate 152 of the level shifter is also insulated from the metallization layer 132 by the lower insulator layer 102. The level shifter shifts the voltage level e.g. between a high side switch and a low side switch of a gate driver circuit. For example, the semiconductor component shown in FIG. 1 may be a gate driver circuit and the power transistor may form a high or low-side switch of the gate driver circuit (the complimentary switch is out of view in this case). The high-side switch sources current to the load and the low-side switch connects or disconnects the load to ground, sinking current from the load. Other circuit configurations are contemplated for the level shifter, and the level shifter may be excluded altogether for power transistor circuits not requiring voltage shifting.

Another type of device which can be at least partly formed in the lower first semiconductor layer 104 is an interconnect structure. The interconnect structure can be formed from one or more regions of polysilicon or heavily doped semiconductor material or e.g. silicided semiconductor material arranged in the lower semiconductor layer 104. The interconnect structure can laterally electrically connect devices formed in the lower semiconductor layer 104 and/or provide a lateral connection from the metallization layer 132 to a region 154 of the upper semiconductor layer 108. FIG. 1 shows an embodiment of a resistor 156 which electrically connects the metallization layer 132 to a region 154 of the upper semiconductor layer 108. The region 154 of the upper semiconductor layer 108 connected to the buried resistor 156 can be laterally insulated from adjacent regions of the upper semiconductor layer 108 by an insulating material 150 as shown in FIG. 1. The resistor 156 can likewise be laterally insulated from adjacent regions of the lower semiconductor layer 104 also as shown in FIG. 1. The resistivity of the buried resistor 156 can be controlled via its doping concentration.

In general, adjacent regions of the lower semiconductor layer 104 can be laterally insulated to ensure proper device isolation. In one embodiment, the regions can be laterally insulated from each other on the rear side by forming the regions in an n-type well 157 at the highest potential occurring in this location e.g. the drain potential. P-type regions are then insulated with pn insulating regions. Further, n-type regions can be located in the p-type regions. In another embodiment, adjacent regions are laterally insulated from one another by an insulating material 158 such as STI (shallow trench isolation) formed in the lower semiconductor layer 104 as shown in FIG. 1. The depth of the STI 158 preferably reaches at least from the lower insulating layer 102 to the upper insulating layer 106. STI could extend deeper into the semiconductor from the rear side if desired. When STI or pn-junction insulation does not extend over the full depth of the lower semiconductor layer 104 a (leakage) current will flow between the devices integrated in the lower semiconductor layer 104 which may be not desired.

FIGS. 2-21 illustrate several embodiments of process steps for manufacturing a semiconductor component having vertically integrated devices using stacked SOI structures. These embodiments provide both self-alignment and thus very precise thin dimensions and also integrate various functions on the rear (bottom) side of the semiconductor component.

Figure 2:
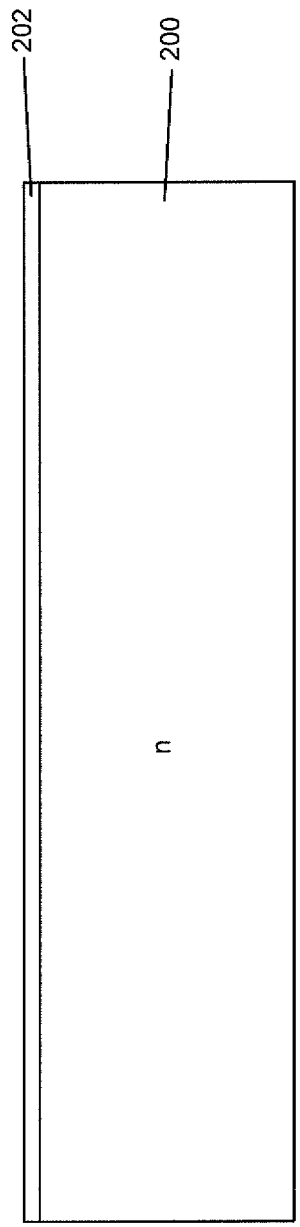
FIGS. 2-21 illustrate cross-sectional schematic views of a semiconductor structure at various processing steps according to different embodiments of manufacturing a vertically integrated semiconductor component.

FIG. 2 shows a semiconductor substrate 200 such as a silicon wafer provided with an insulator layer 202 disposed on a top side. The insulator layer 202 subsequently forms the upper (second) insulator layer 106 of the semiconductor component 100 shown in FIG. 1. The insulator layer 202 can be formed by oxidizing the wafer. The substrate 200 has an intrinsic doping such as n-type as shown in FIG. 2 or p-type.

Figure 3:
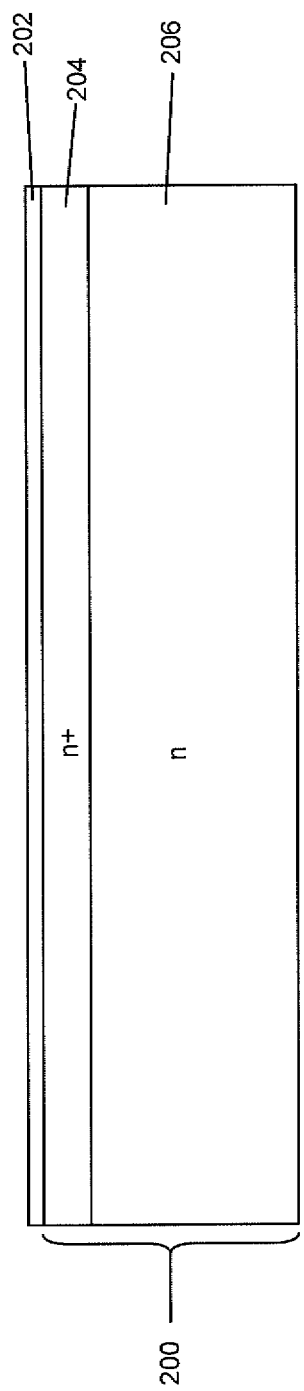

FIG. 3 shows the substrate 200 with a more highly doped region 204 adjacent the insulator layer 202 and a less heavily doped region 206. The more highly doped region 204 can be formed by implanting dopants into the substrate 200 at a depth below the insulator layer 202 on the entire surface or locally e.g. by varnish masking. A rear side emitter, field stop zones and/or edge termination for the rear side can be formed later, which can be formed in this manner alternatively also for the front side pn junction. Application of the dopants at this juncture of the process permits a diffusion of the dopants, since the doping provides for the complete temperature budget of the process. A lateral diffusion boundary can be realized when necessary with a lateral STI (not shown in FIG. 3), which reaches up to the insulator layer 202.

Figure 4:
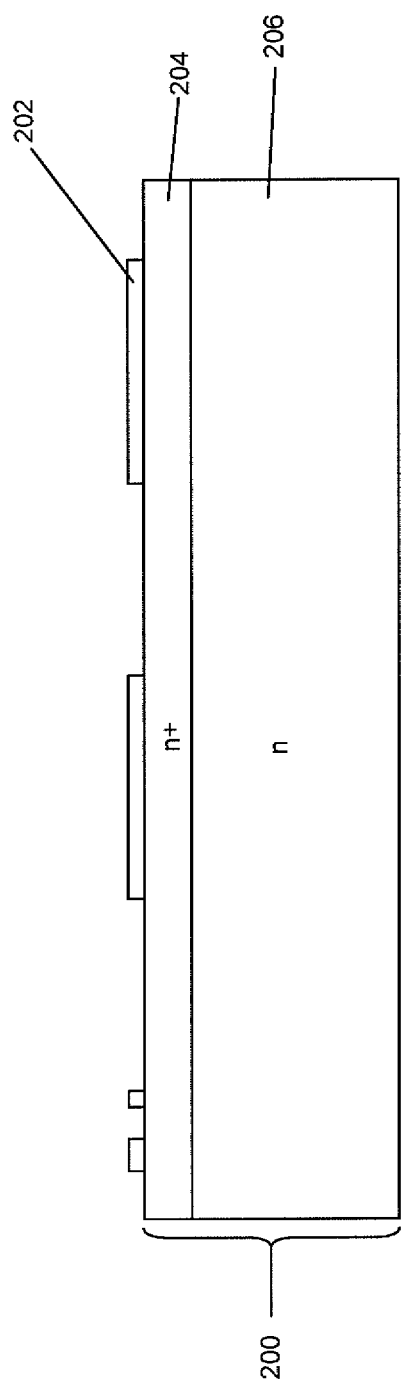

FIG. 4 shows the substrate 200 after the insulator layer 202 is patterned. The insulator layer 202 can be patterned using any conventional technique such as masking and etching. The insulator layer 202 is patterned to form the desired electrical connections between the lower semiconductor layer 104 of the component shown in FIG. 1 and the upper semiconductor layer 108.

Figure 5:
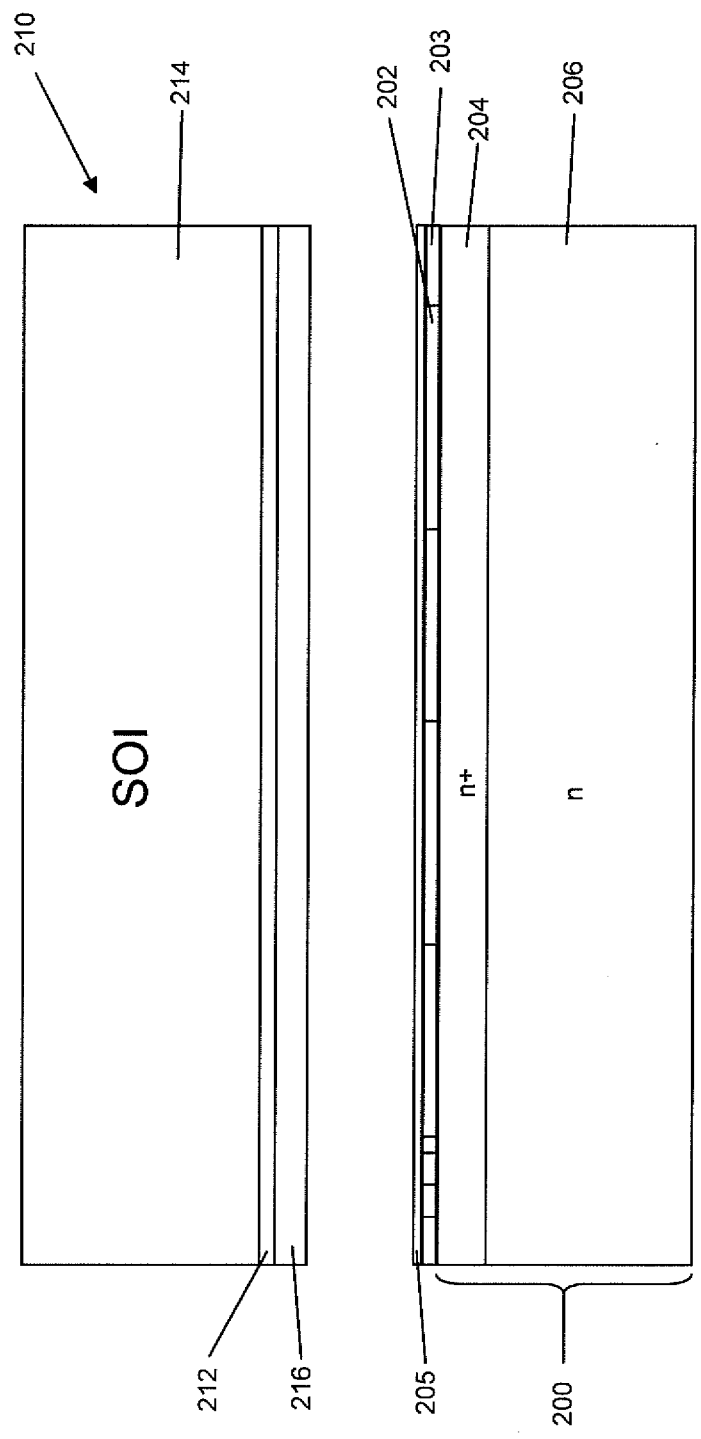

FIG. 5 shows an SOI substrate 210 provided with a buried oxide layer 212 isolating a thicker bulk region 214 from a thinner semiconductor layer 216. The SOI substrate 210 can be formed using any conventional technique such as smart cut or SIMOX (separation by implanted oxygen). The thin semiconductor layer 216 can optionally be blanket or locally implanted with dopants at this point if desired. Thin semiconductor layers provided with SOI substrates are generally quite thin and have a well defined thickness, and therefore are well-suited for power transistor circuit applications where device thickness and thickness variation have a strong affect on blocking voltage capability as previously explained herein.

In order to achieve a suitable wafer bond, existing windows in the insulator layer 202 are filled with a conductive material 203 e.g. poly-crystalline or mono-crystalline semiconductor material and a thin oxide 205 may be formed on top of the conductive material 203. The surface of the substrate 200 is preferably relatively planar to provide a surface suitable for wafer bonding. The SOI substrate 210 may be bonded to a planar surface including alternating structures of filling material 203, patterned insulator layer 202 and optional thin oxide 205, or to a planar surface of filling material 203 in case the patterned windows in the insulator layer 202 and the insulator layer 202 are overfilled.

Figure 6:
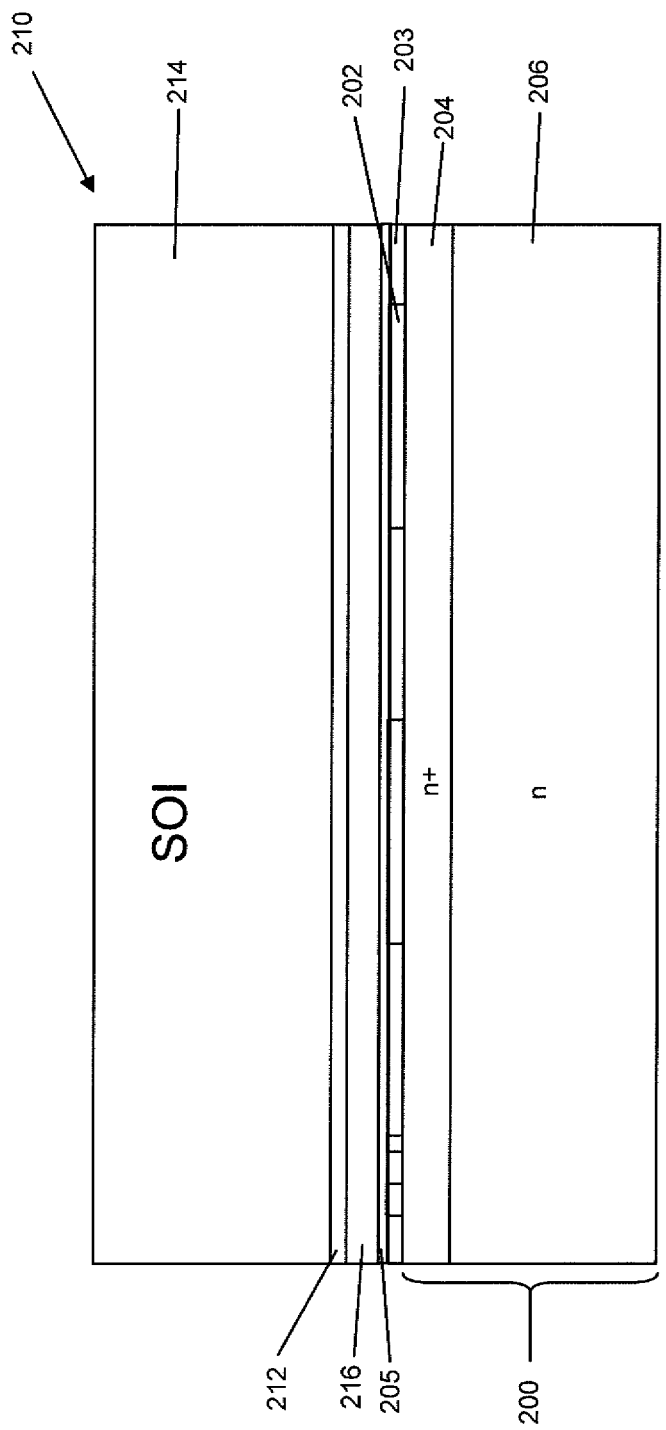

FIGS. 6 shows the SOI substrate 210 bonded to the first substrate 200 with the insulator layer 202 formed on the first substrate 200 adjacent the thinner semiconductor layer 216 of the SOI substrate 210. The optional thin oxide 205, if used, can be effectively removed or transformed into small oxide islands embedded in the surrounding semiconductor material via a heat treatment. The bulk region 214 of the SOI substrate 210 is then removed. In one embodiment, the composite structure is mounted on a grinding carrier and thinned from the rear side. Most of the bulk region 214 can be removed first with grinding. The buried oxide layer 212 can serve as a stop during the thinning process, for example during a CMP (chemical-mechanical polishing) process or chemical etching process. The buried oxide layer 212 is rendered unstructured during the thinning.

Figure 7:
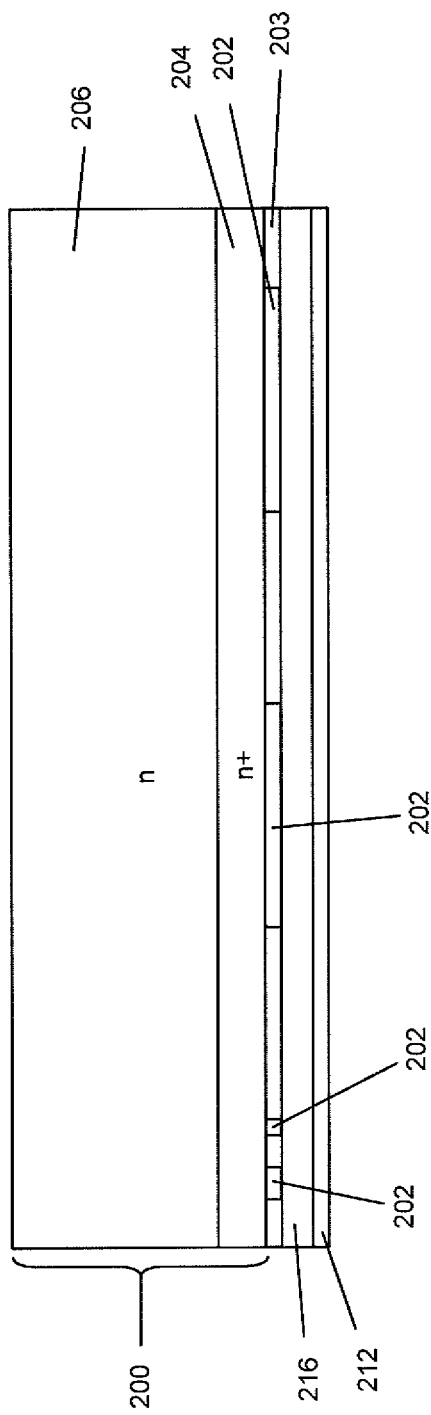

FIG. 7 shows the structure after thinning of the SOI substrate 210. The first (lower) insulator layer 102 of the sequence of layers shown in FIG. 1 is formed by the buried oxide layer 212 of the SOI substrate 210, the first (lower or buried) semiconductor layer 104 is formed by the thinner semiconductor layer 216 of the SOI substrate 210, the second (upper) insulator layer 106 is formed by the insulator layer 202 of the first substrate 200, and the second (upper) semiconductor layer 108 is formed by the semiconductor material of the first substrate 200. The bulk region 214 of the SOI substrate 210 is removed. FIG. 7 shows the first substrate 200 on top, with the buried oxide layer 212 of the SOI substrate 210 on the bottom. The insulator layer 202 disposed between the semiconductor layers 200, 212 was previously patterned as described above. Openings in the lower insulator layer 212 can be etched later in the processing, and then local contacts formed e.g. with metallization as described later herein. The conductive material 203 which fills the windows in the insulator layer 202 is showed as a single layer with the thin semiconductor layer 216 in the remaining figures for ease of illustration only.

Figure 8:
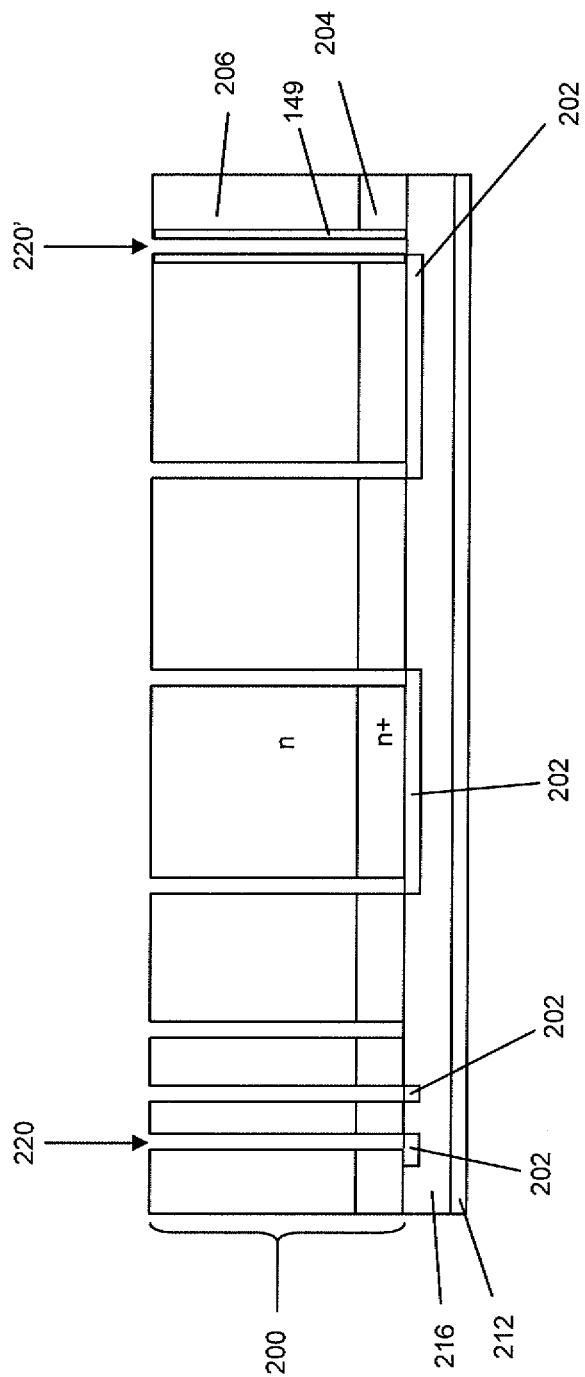

FIG. 8 shows trenches 220 formed in the upper semiconductor layer 200. The trenches 220 can be formed by selectively etching the semiconductor material in the desired areas. Each trench 220 extends to the upper insulator layer 202 and surrounds a corresponding region of the upper semiconductor layer 200. The upper insulator layer 202 can therefore act as an etch stop. The trenches 220 are subsequently used for lateral isolation. The trench 220' on the right-hand side of FIG. 8 will be used to facilitate an electrical connection.

Figure 9:
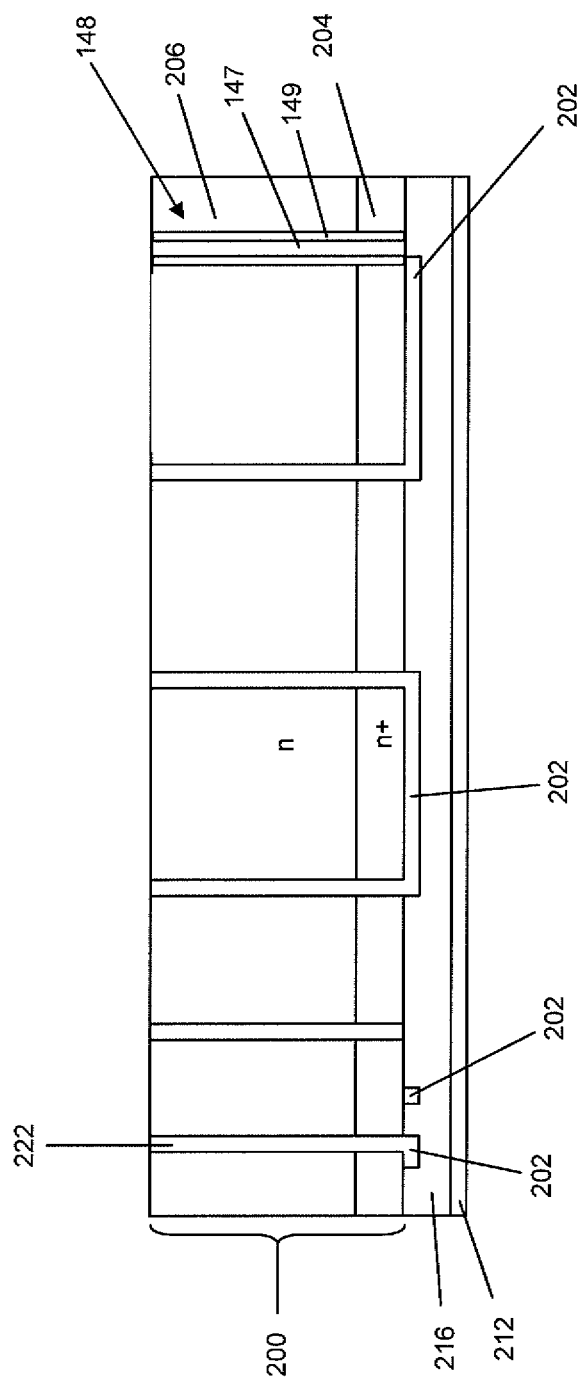

FIG. 9 shows the isolation trenches 220 filled with a dielectric material 222 such as oxide. The dielectric material 222 can be formed using any conventional process such as deposition of a dielectric layer or thermal oxidation or a combination of such conventional processes. For example, the dielectric material 222 can be produced at over the whole area including the sidewalls and bottoms of the trenches 220, filling the trenches 220 with the dielectric material 222. The trench 220' on the right-hand side of FIG. 9 is filled with a conductive material 147 such as a metal, polysilicon or a metal silicide to form an electrical connection e.g. between the cathode 142 of the diode shown in FIG. 1 and the drift control zone 144.

Figure 10:
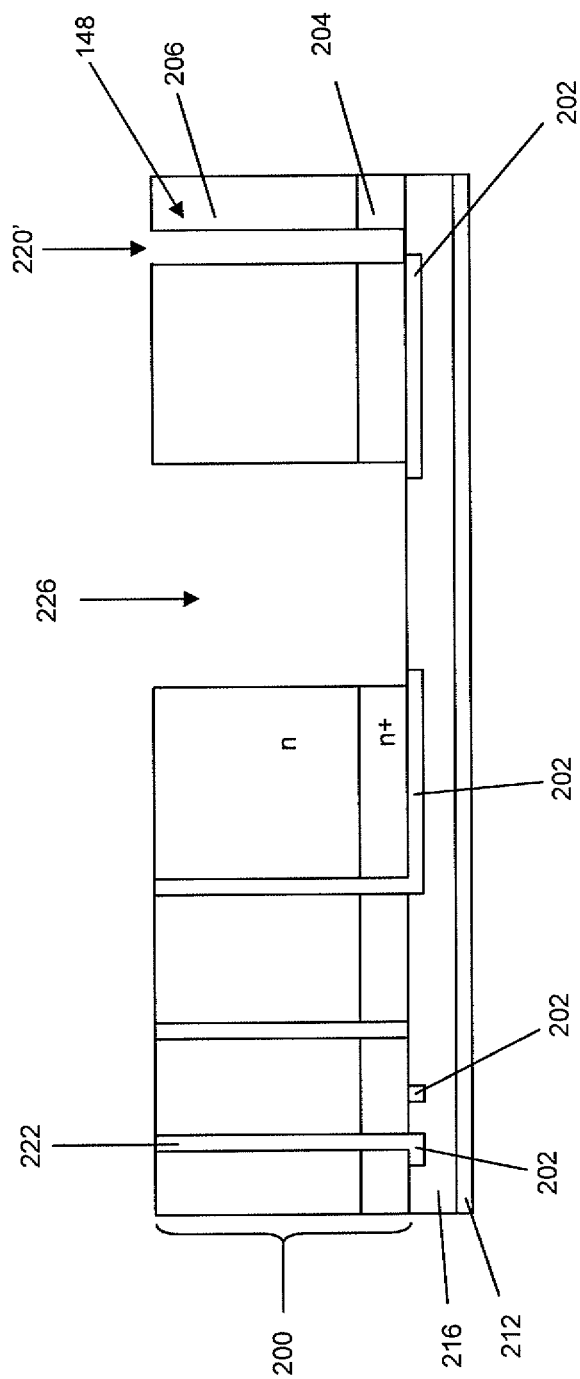
Figure 11:
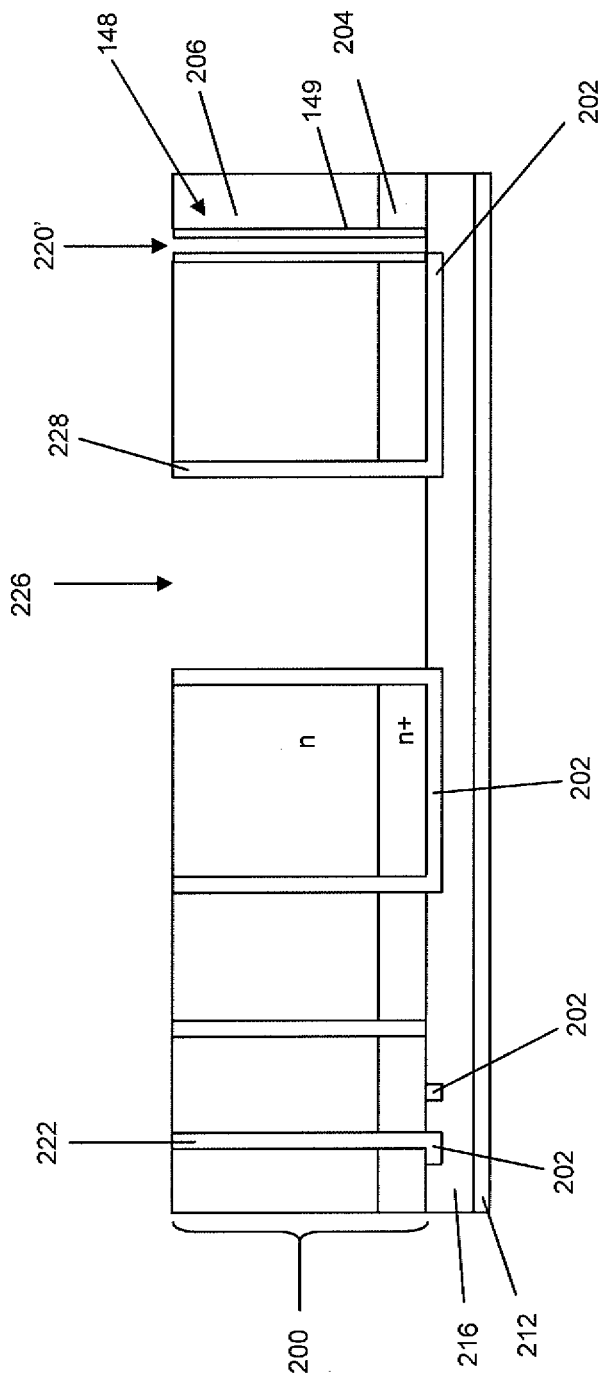
Figure 12:
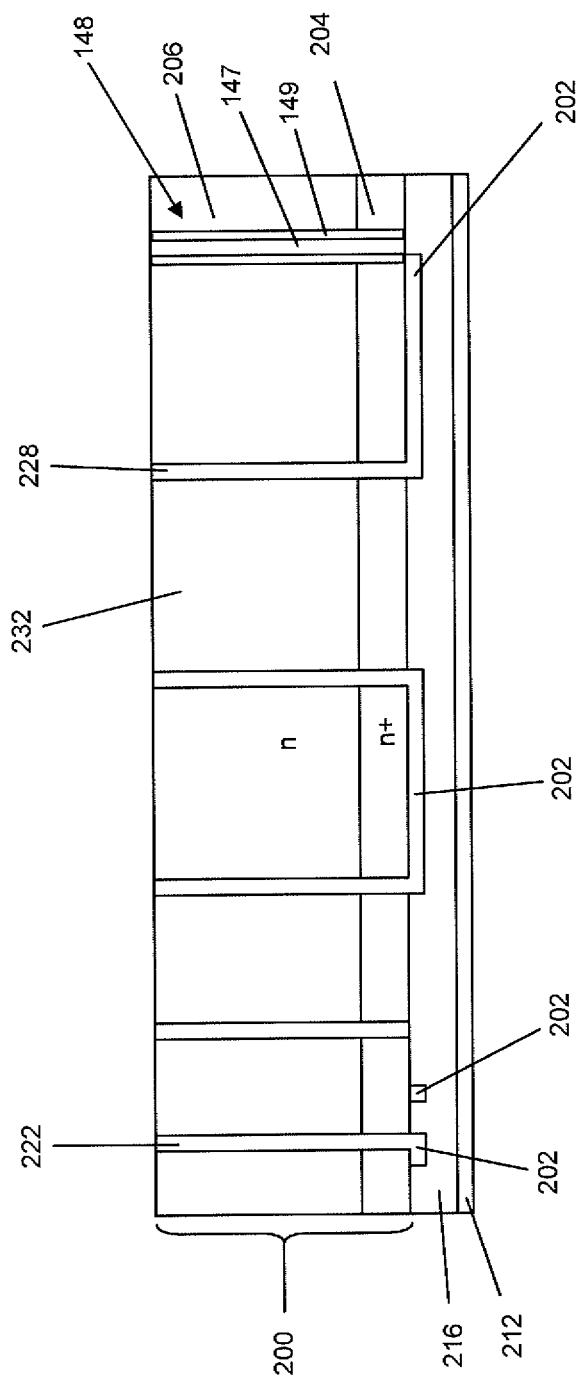

FIGS. 10-12 show an alternate embodiment of laterally isolating the power transistor from adjacent regions of the upper semiconductor layer 200. According to this embodiment, a portion of the upper semiconductor layer 200 is etched to the upper insulator layer 202, forming a trench 226 as shown in FIG. 10. An insulating material 228 is then formed on each surrounding sidewall 230 of the remaining upper semiconductor layer 200 as shown in FIG. 11. An insulating material 149 is also similarly formed in the trench 220' shown at the right-hand side of FIG. 11. The sidewall insulation 228, 149 can be formed using any conventional process such as thermal oxidation. The bottom insulator in the large trench 226 is removed e.g. in an anisotropic etch process. An epitaxial layer 232 of semiconductor material is then grown in the trench 226 created by the etching process as shown in FIG. 12. The epitaxial layer 232 is doped during the epitaxy process to form part of the vertical power transistor e.g. the drift zone. A conductive material 147 is also similarly formed in the right-most trench in FIG. 12. Body and source regions (e.g. body 120 and source 122 in FIG. 1) can be formed by implantation and diffusion. The insulator 228 can be removed in a further etch step. The trench formed thereby can be filled with a new insulator. The trenches 220, 220' formed in the upper semiconductor layer 200 are filled as described above.

Figure 13:
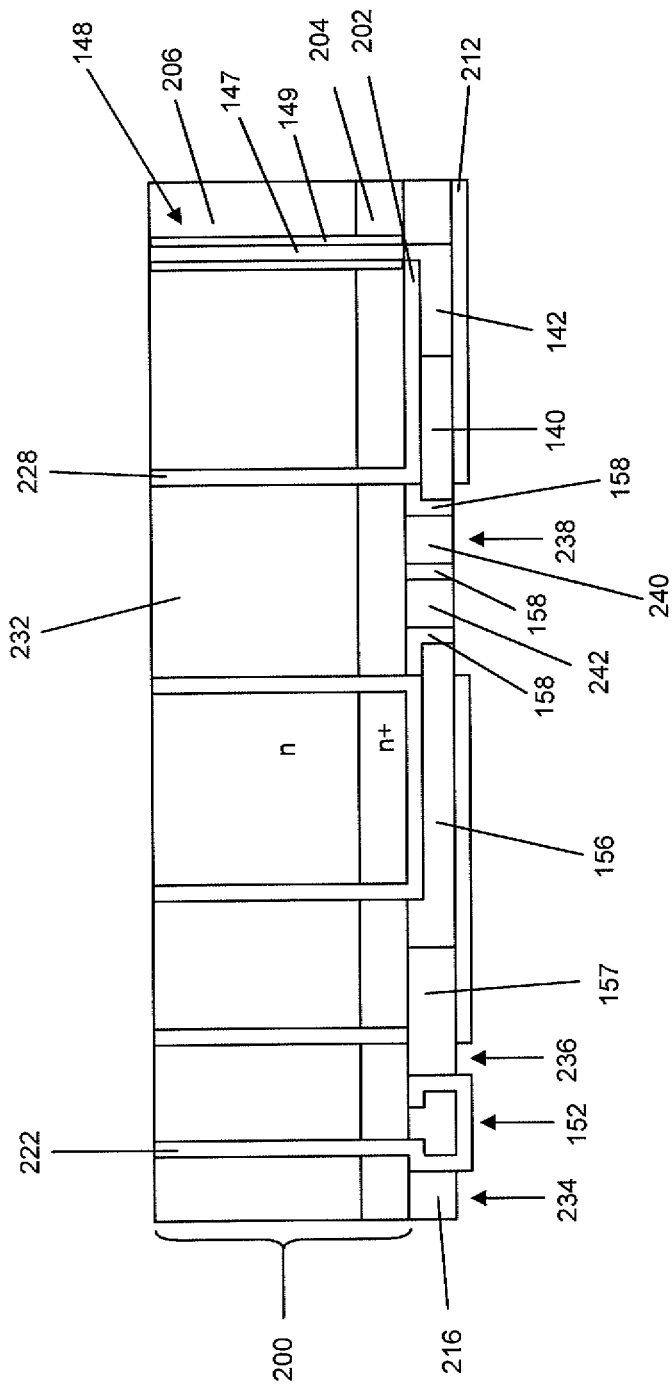

FIG. 13 shows the structure after contact openings 234, 236, 238 are formed in the lower insulator layer 212. The contact openings 234, 236, 238 can be formed using any conventional process such as masking and etching. The contact openings 234, 236, 238 extend to the lower semiconductor layer 216. The device regions can be formed in the lower semiconductor layer 216 by appropriately doping the layer 216. For example, the drain of the power transistor, the resistor 156, the gate 152 of the level shifter, and the anode 140 and cathode 142 of the diode can be formed in the lower semiconductor layer 216 by implanting the appropriate type of dopants into the layer 216 and annealing or outdiffusion. The different device regions can be laterally insulated as well e.g. using pn junction isolation or STI 158.

FIG. 13 shows the portion of the power transistor included in the lower semiconductor layer 216 including two doped regions 240, 242. The first region 240 forms an emitter and the second region 242 is insulated from the emitter and forms an n-type region shorting the backside drain.

Figure 14:
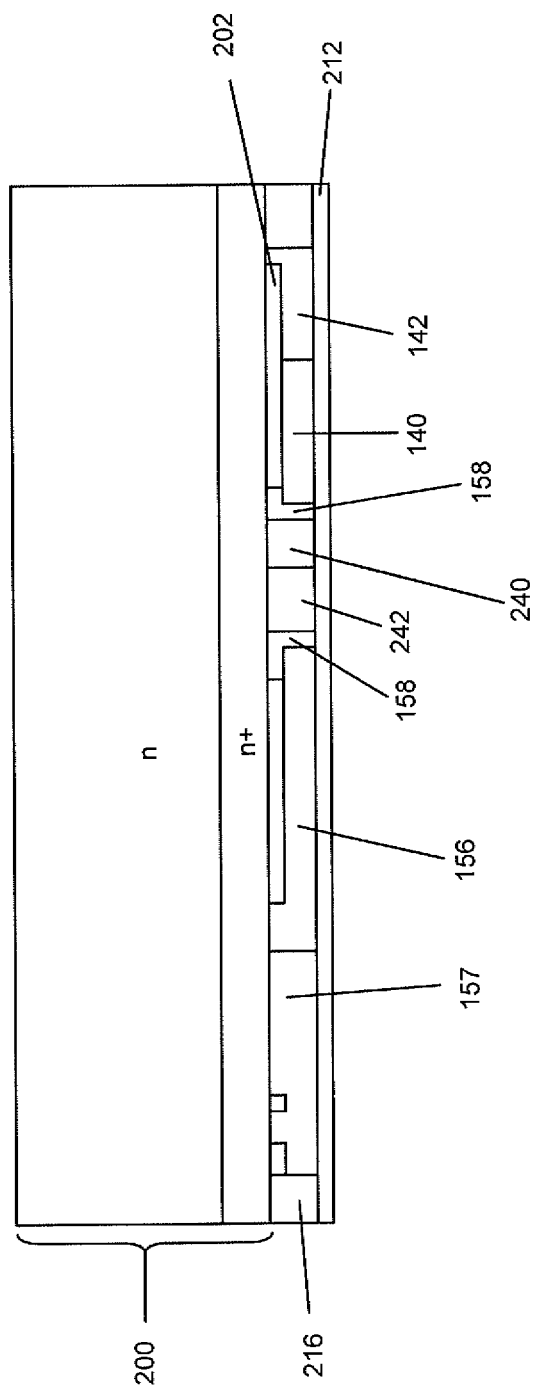
Figure 15:
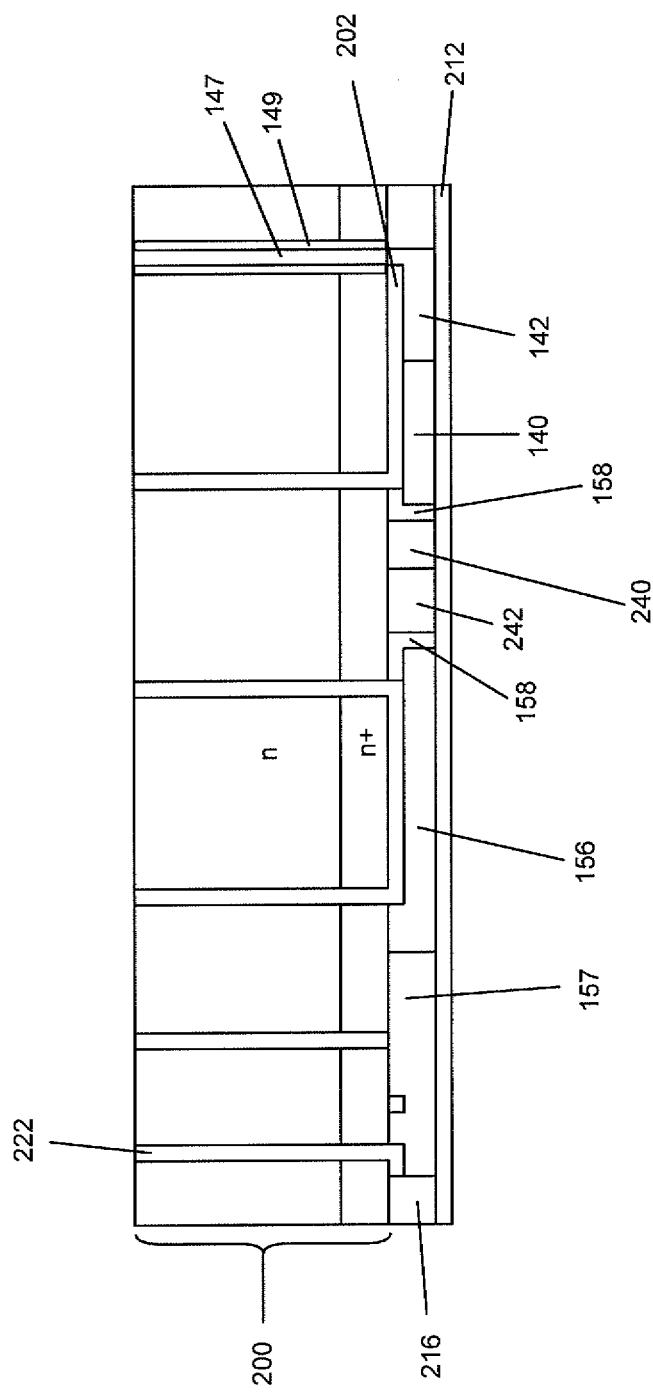

FIGS. 14-15 show an alternate embodiment where the lower semiconductor layer 216 is doped earlier in the process. According to this embodiment, the lower semiconductor layer 216 is doped to form the different device regions prior to the isolation regions being formed in the upper semiconductor layer 200. FIG. 15 shows the structure after the device regions in the upper semiconductor layer 200 are laterally insulated from one another via the isolation trenches filled with dielectric material 222.

Figure 16:
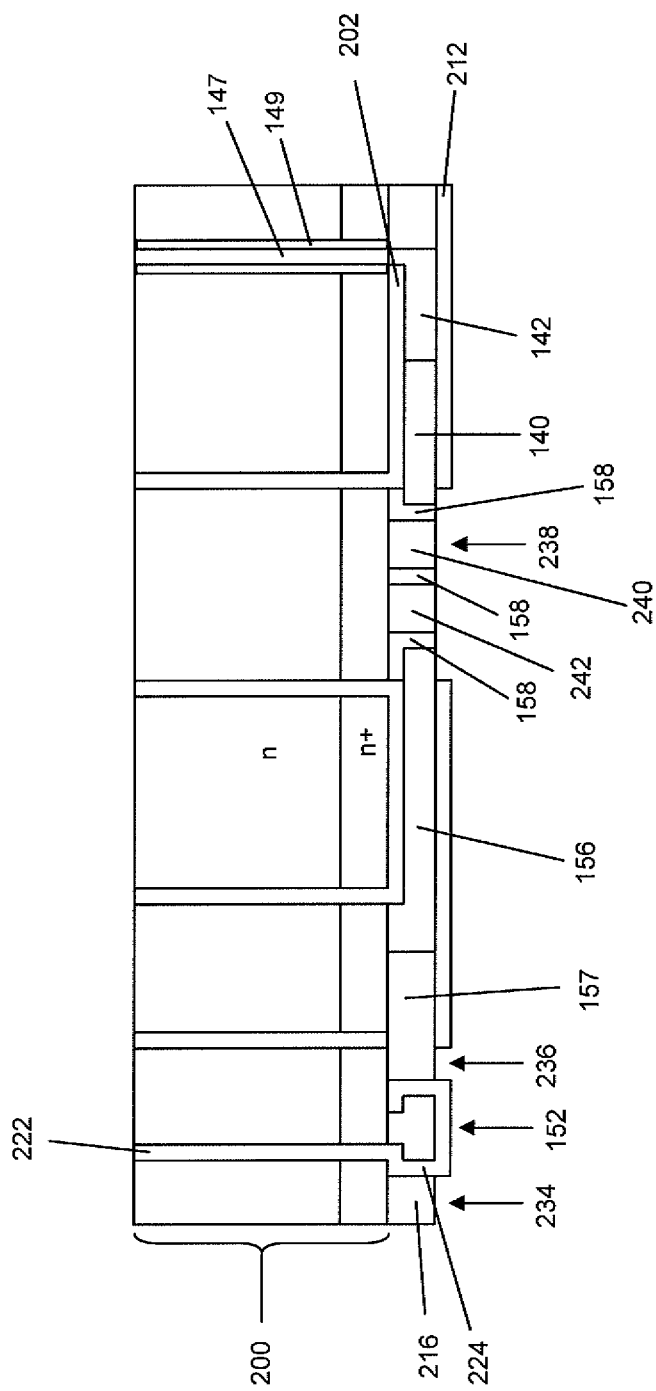

FIG. 16 shows the structure after the lower insulator layer 212 is patterned to form the openings 234, 236, 238 to the different device regions in the lower semiconductor layer 216. Any conventional process can be used to form the openings 234, 236, 238 in the lower insulator layer 212 such as masking and etching. Sidewall insulation 224 can also be formed along sidewalls of the lower semiconductor layer 216 e.g. to form the insulated gate 152 of the level shifter.

The power transistor could be an IGBT in some embodiments. Accordingly, the region of the lower semiconductor layer 216 allocated to the power transistor could include an integrated reverse diode. The power transistor could also be constructed as shown in FIG. 1, or any other desired configuration.

In each case, the lower semiconductor layer 216 includes devices or portions of integrated devices. Remaining portions of the devices can be fabricated in the upper semiconductor layer 200 and/or in additional semiconductor layers, and except for the power transistor examples described herein, are not shown in the interest of clarity. These device regions can be formed using any suitable conventional processing techniques, and can involve dopant implantation, dielectric formation, metallization, device isolation, etc.

Figure 17:
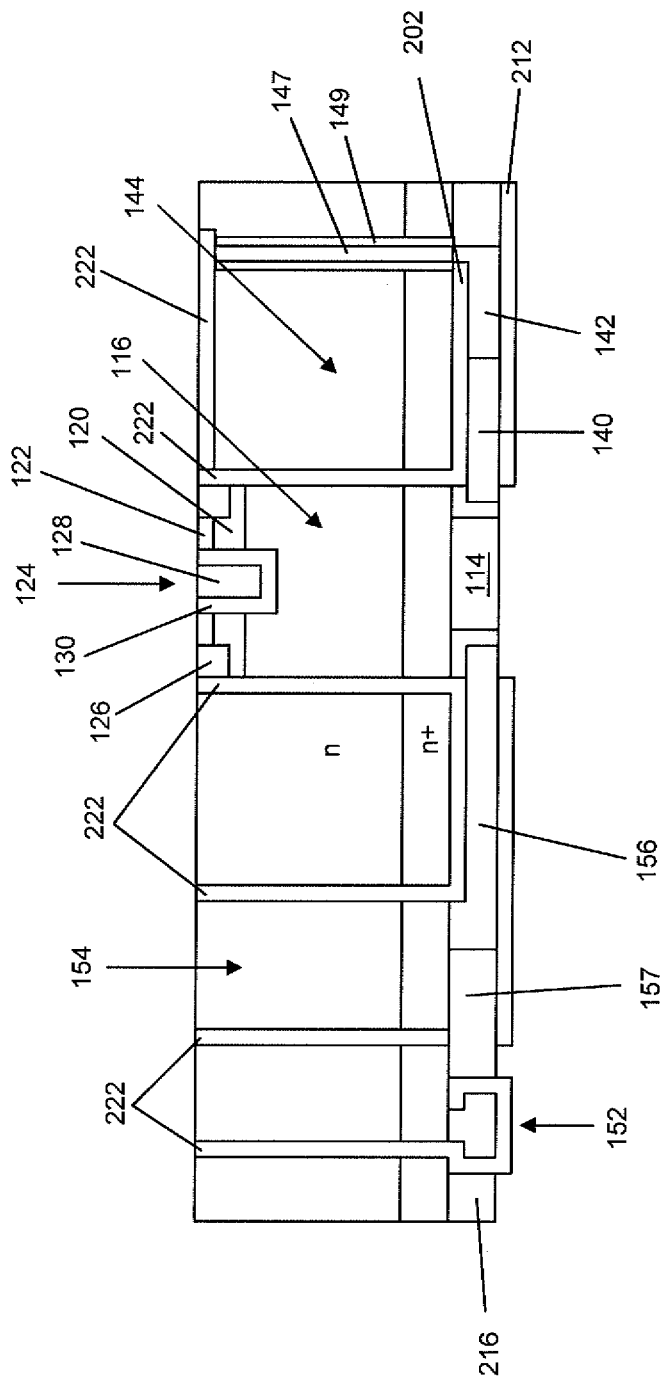

FIG. 17 shows the structure after the power transistor is formed. The region 116 of the upper semiconductor layer 200 allocated for the power transistor is doped to form the drift zone, the body 120 and the source 122 of the power transistor. This can include doping this region 116 of the upper semiconductor layer 200 after the insulation-filled isolation trenches 222 are formed, or doping the epitaxial region 232 grown after sidewall oxidization, both as previously described herein. The gate 124 is formed adjacent the body 120, and is shown as a trench gate structure in FIG. 17. Insulation and metallization layers on top of the upper semiconductor layer 200 are not shown for ease of illustration only. Alternatively, the gate 124 may be formed on the surface of the upper semiconductor layer 200, both as well known in the art.

Figure 18:
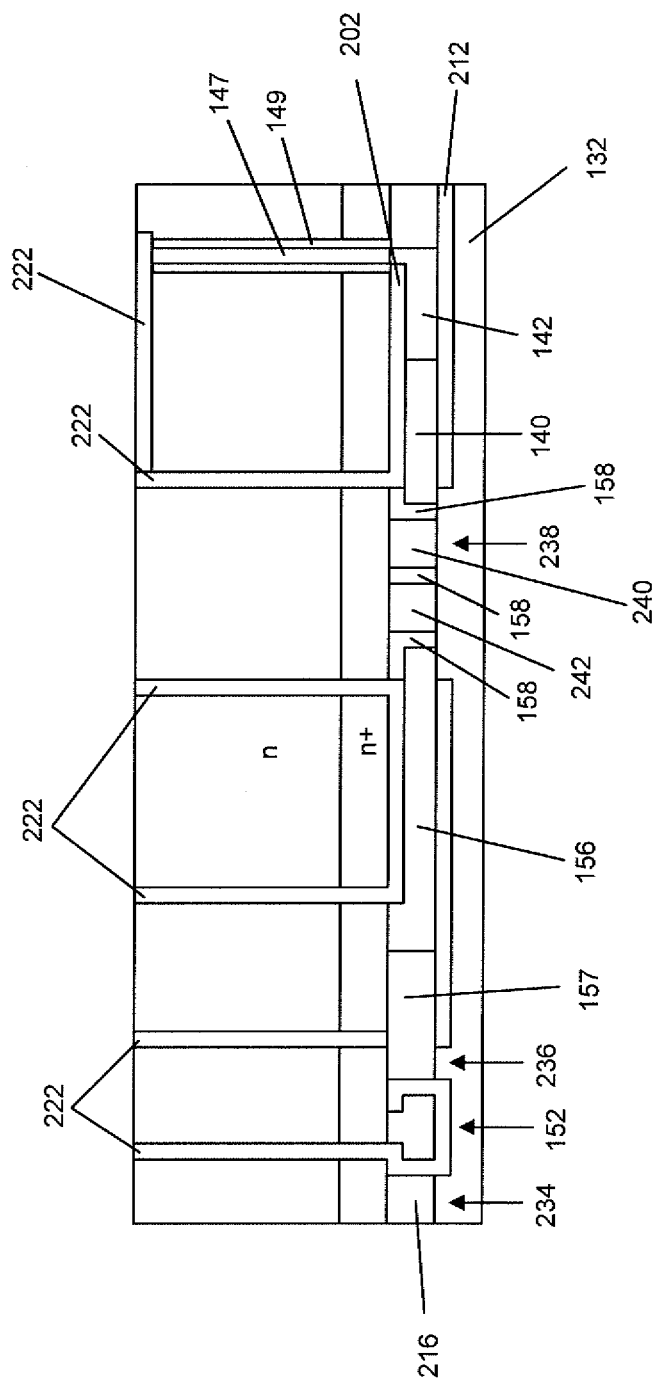

FIG. 18 shows the structure with a metallization layer 132 formed on the lower insulator layer 212. Formation of the metallization layer 132 can be carried out with the formation of other conductors. The backside metallization layer 132 can be made of conventional metals or a sequence of metal layers, or an alloy or a sequence of at least one alloys and/or metal layer. Useful metals in this regard include Al, Au, Ag, Ti, Ni, V, Pt, Cu and many others. Further insulation layers can be provided with contact windows and deployed above these conductors. Regardless, the metallization layer 132 is in electrical contact with the device regions formed in the lower semiconductor layer 216 through the corresponding contact openings 234, 236, 238 previously formed therein. The anode 142 of the diode and the emitter 240 of the power transistor are both connected to the metallization layer 132 through the same opening 238 in the lower insulator layer 212 according to this embodiment. The metallization layer 132 also contacts one end of the resistor 156 and other laterally isolated regions of the lower semiconductor layer 216. The metallization layer 132 may also actuate the gate 152 of the level shifter according to this embodiment. The metallization layer 132 can be patterned to provide the desired electrical contacts between the metallization layer 132 and the devices formed in the lower semiconductor layer 104. The metallization layer 132 can cover substantially the entire chip backside or can be patterned to provide insulated electrodes. Of course, other configurations are contemplated. For example, one or more lateral CMOS (complimentary metal oxide semiconductor) devices, capacitors, etc. can be formed in the lower semiconductor layer 216. In each case, the lower insulator layer 212 is preferably patterned prior to formation of the metallization layer.

Figure 19:
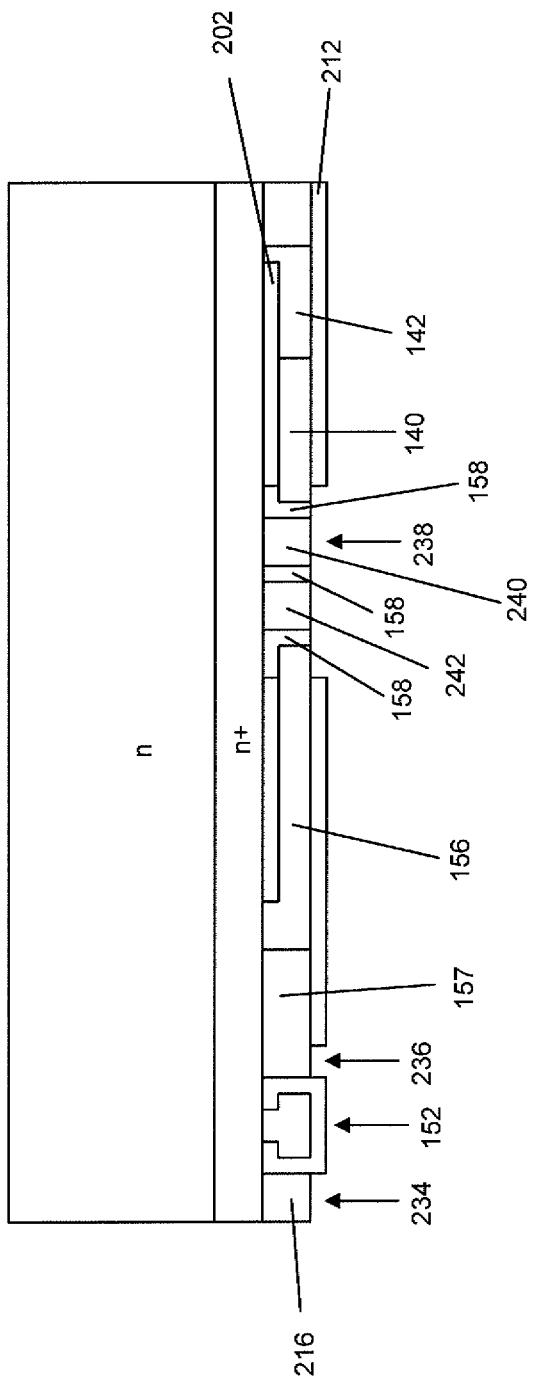
Figure 20:
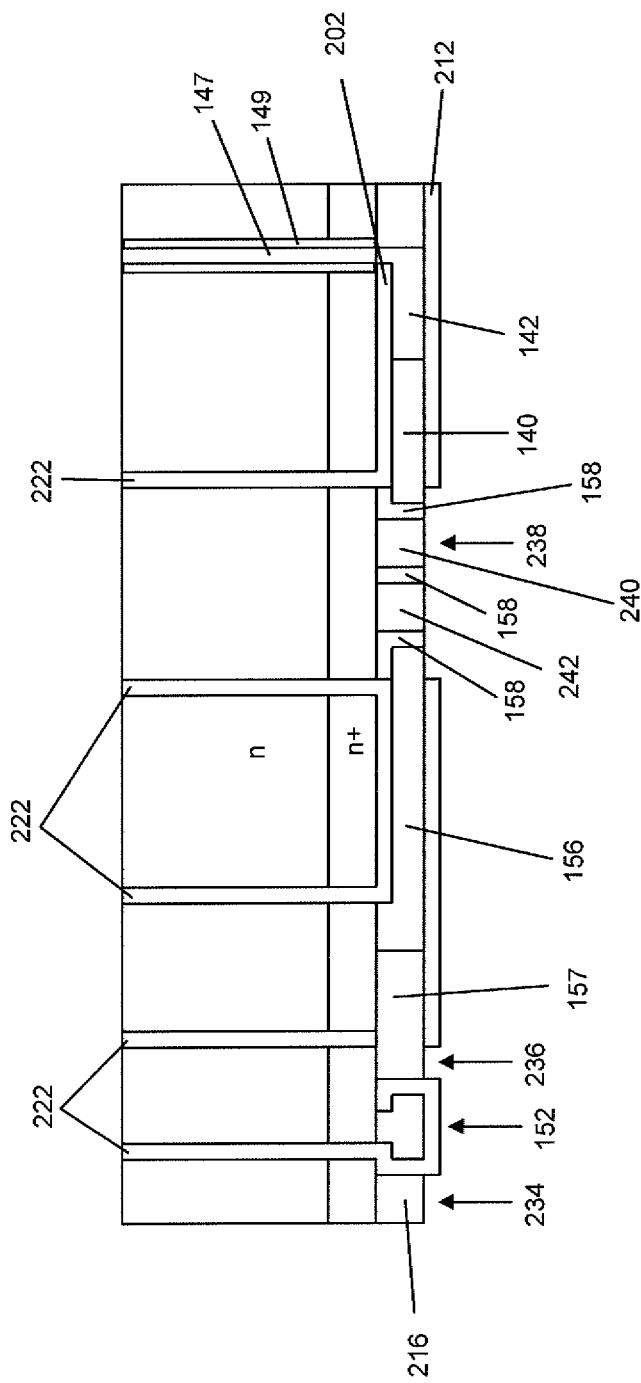
Figure 21:
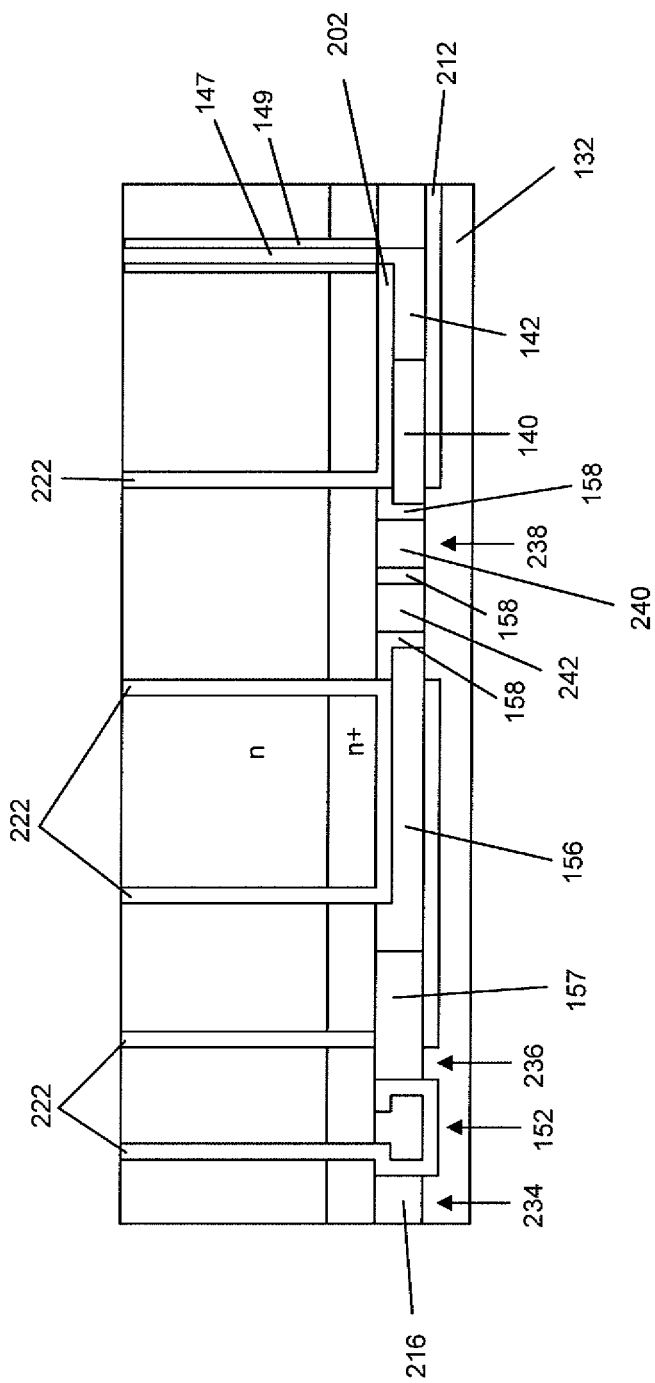

FIGS. 19-21 show an alternate embodiment where the lower insulator layer 212 is patterned earlier in the process. According to this embodiment, the lower insulator layer 212 is patterned prior to the isolation regions being formed in the upper semiconductor layer 200 as shown in FIG. 19. The insulated trenches 222 and/or sidewall insulation 228 in the power transistor region are then formed in the upper semiconductor layer 200 as shown in FIG. 20. The metallization layer 132 is then formed on the lower insulator layer 212 as shown in FIG. 21, and further processing can be formed to complete the devices in the upper semiconductor layer. The metallization layer 132 can be formed as separate metal sections or a single layer. Also, the embodiments described herein can be readily extended to include the use of multiple SOI wafers to form a component structure having more than one buried semiconductor layer.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
a sequence of layers including a first insulator layer, a first semiconductor layer disposed on the first insulator layer, a second insulator layer disposed on the first semiconductor layer, and a second semiconductor layer disposed on the second insulator layer; and
a plurality of devices at least partly formed in the first semiconductor layer, a first one of the plurality of devices being a power transistor formed in a first region of the first semiconductor layer and a first region of the second semiconductor layer, the first region of the first and second semiconductor layers being in electrical contact with one another through a first opening in the second insulator layer.

2. The semiconductor component of claim 1, further comprising a metallization layer disposed on the first insulator layer so that the first insulator layer is interposed between the metallization layer and the first semiconductor layer, wherein the metallization layer is in electrical contact with a plurality of regions of the first semiconductor layer including the first region through corresponding openings in the first insulator layer.

3. The semiconductor component of claim 2, wherein the first region of the first semiconductor layer forms at least a part of a drain of the power transistor.

4. The semiconductor component of claim 1, wherein another one of the plurality of devices is a diode having an anode and a cathode formed in a second region of the first semiconductor layer which is laterally spaced apart from the first region of the first semiconductor layer.

5. The semiconductor component of claim 4, wherein the anode is in electrical contact with the metallization layer and the cathode is in electrical contact with a second region of the second semiconductor layer through a second opening in the second insulator layer, the first and second regions of the second semiconductor layer being laterally insulated from one another.

6. The semiconductor component of claim 5, wherein the first region of the second semiconductor layer forms a drift zone of the power transistor and the second region of the second semiconductor layer forms a drift control zone operable to control a conducting channel in the drift zone.

7. The semiconductor component of claim 2, wherein another one of the plurality of devices is a level shifter having a gate formed in a second region of the first semiconductor layer laterally insulated from the first region of the first semiconductor layer, the gate of the level shifter being insulated from the metallization layer by the first insulator layer.

8. The semiconductor component of claim 1, wherein another one of the plurality of devices is an interconnect structure formed in a second region of the first semiconductor layer laterally insulated from the first region of the first semiconductor layer.

9. The semiconductor component of claim 1, wherein another one of the plurality of devices is a resistor formed in a second region of the first semiconductor layer which is laterally spaced apart from the first region of the first semiconductor layer.

10. A semiconductor component, comprising:
- a sequence of layers including a first insulator layer, a first semiconductor layer disposed on the first insulator layer, a second insulator layer disposed on the first semiconductor layer, and a second semiconductor layer disposed on the second insulator layer;
- a power transistor having a drain formed in a first region of the first semiconductor layer and a drift zone, body, source and gate formed in a first region of the second semiconductor layer, the drift zone being electrically connected to the drain through a first opening in the second insulator layer; and
- a diode having an anode and a cathode formed in a second region of the first semiconductor layer, the anode being electrically connected to the drain of the power transistor and the cathode being electrically connected to a second region of the second semiconductor layer through a second opening in the second insulator layer, the first and second regions of the second semiconductor layer being laterally insulated from one another.

11. The semiconductor component of claim 10, further comprising a metallization layer disposed on the first insulator layer so that the first insulator layer is interposed between the metallization layer and the first semiconductor layer, wherein the metallization layer is in electrical contact with the drain of the power transistor and the anode of the diode.

12. The semiconductor component of claim 10, wherein the first region of the second semiconductor layer forms a drift zone of the power transistor and the second region of the second semiconductor layer forms a drift control zone operable to control a conducting channel in the drift zone.

13. The semiconductor component of claim 10, further comprising a level shifter having a gate formed in a third region of the first semiconductor layer laterally insulated from the first and second regions of the first semiconductor layer, the gate of the level shifter being insulated from the metallization layer by the first insulator layer.

14. The semiconductor component of claim 10, further comprising an interconnect structure formed in a third region of the first semiconductor layer laterally insulated from the first and second regions of the first semiconductor layer.

* * * * *